(12) United States Patent
Domke et al.

(10) Patent No.: US 8,464,587 B2
(45) Date of Patent: Jun. 18, 2013

(54) SENSOR FOR EXAMINING A VALUE DOCUMENT, AND METHOD FOR THE PRODUCTION OF SAID SENSOR

(75) Inventors: Jan Domke, München (DE); Hans-Uwe Moosler, München (DE); Joseph Lohner, München (DE)

(73) Assignee: Giesecke & Devrient GmbH, Munich (DE)

( * ) Notice: Subject to any disclaimer, the term of this patent is extended or adjusted under 35 U.S.C. 154(b) by 896 days.

(21) Appl. No.: 12/441,825

(22) PCT Filed: Sep. 18, 2007

(86) PCT No.: PCT/EP2007/008127
§ 371 (c)(1),
(2), (4) Date: Jul. 15, 2009

(87) PCT Pub. No.: WO2008/034590
PCT Pub. Date: Mar. 27, 2008

(65) Prior Publication Data
US 2010/0005888 A1    Jan. 14, 2010

(30) Foreign Application Priority Data
Sep. 19, 2006 (DE) .......................... 10 2006 043 882

(51) Int. Cl.
*G01N 9/04* (2006.01)
(52) U.S. Cl.
USPC .......................................................... 73/596
(58) Field of Classification Search
USPC .......................................................... 73/596
See application file for complete search history.

(56) References Cited

U.S. PATENT DOCUMENTS

| 3,782,543 | A |   | 1/1974  | Martelli et al. |         |
|-----------|---|---|---------|-----------------|---------|
| 4,763,189 | A |   | 8/1988  | Komatsu et al.  |         |
| 5,418,384 | A |   | 5/1995  | Yamana et al.   |         |
| 6,145,834 | A | * | 11/2000 | Hirota et al.   | 271/225 |
| 6,172,745 | B1|   | 1/2001  | Voser et al.    |         |

(Continued)

FOREIGN PATENT DOCUMENTS

| CN | 2557927 Y | 6/2003  |
|----|-----------|---------|
| DE | 10122563  | 11/2002 |

(Continued)

OTHER PUBLICATIONS

Search Report of German Patent Office regarding German patent application No. 10 2006 043 882.5, May 23, 2007.

(Continued)

*Primary Examiner* — Lisa Caputo
*Assistant Examiner* — Jamel Williams
(74) *Attorney, Agent, or Firm* — Bacon & Thomas, PLLC

(57) ABSTRACT

A sensor for examining a document of value in a detection range of the sensor has at least one electrical component for converting electrical energy into sound waves and/or electromagnetic fields, in particular optical radiation, for examining the document of value and/or for detecting sound waves and/or magnetic or electromagnetic fields, in particular optical radiation, from the document of value to generate detection signals. Additionally, the sensor has a holder for the component, having a recess or a hole for at least partially accommodating the component, in which the electrical component is held, and on or in which at least one conductive path extends to contact with at least one electrical contact of the electrical component.

23 Claims, 5 Drawing Sheets

U.S. PATENT DOCUMENTS

| | | |
|---|---|---|
| 6,407,964 B1 | 6/2002 | Hornung et al. |
| 6,585,258 B1 * | 7/2003 | Hirota et al. ............. 271/186 |
| 6,760,132 B1 * | 7/2004 | Shibata .................... 358/488 |
| 6,796,559 B2 * | 9/2004 | Hirota et al. ............. 271/225 |
| 7,331,234 B2 * | 2/2008 | Tsujita et al. .............. 73/606 |
| 7,742,154 B2 * | 6/2010 | Ehrich et al. .............. 356/71 |
| 2003/0160386 A1 * | 8/2003 | Hirota et al. ............. 271/298 |
| 2004/0245590 A1 * | 12/2004 | Hsieh et al. ............... 257/433 |
| 2007/0138488 A1 * | 6/2007 | Tasch et al. ................ 257/88 |
| 2007/0187209 A1 * | 8/2007 | Stenzel et al. ............. 194/206 |
| 2008/0259316 A1 * | 10/2008 | Ehrich et al. .............. 356/71 |
| 2010/0005888 A1 * | 1/2010 | Domke et al. .............. 73/596 |
| 2010/0132470 A1 * | 6/2010 | Domke et al. .............. 73/642 |
| 2010/0162813 A1 * | 7/2010 | Chen ...................... 73/514.29 |
| 2010/0271619 A1 * | 10/2010 | Lohner .................... 356/71 |
| 2011/0087440 A1 * | 4/2011 | Lau et al. ................... 702/22 |
| 2011/0180694 A1 * | 7/2011 | Leuthold .................. 250/216 |
| 2011/0187868 A1 * | 8/2011 | Chang et al. ............. 348/163 |
| 2011/0254219 A1 * | 10/2011 | Helmlinger et al. ....... 271/110 |
| 2012/0266678 A1 * | 10/2012 | Domke et al. .............. 73/642 |

FOREIGN PATENT DOCUMENTS

| | | |
|---|---|---|
| JP | 59099237 | 6/1984 |
| WO | 0218150 | 3/2002 |
| WO | 2004068447 | 8/2004 |
| WO | 2005048358 | 5/2005 |

OTHER PUBLICATIONS

International Search Report for PCT/EP2007/008127, Mar. 6, 2008.

* cited by examiner

SENSOR FOR EXAMINING A VALUE DOCUMENT, AND METHOD FOR THE PRODUCTION OF SAID SENSOR

FIELD OF THE INVENTION

The present invention relates to a sensor for examining a document of value as well as a method for producing the sensor.

BACKGROUND

Documents of value are understood as sheet-shaped objects, which represent for example a monetary value or an authorization and which should therefore not be producible at will by unauthorized persons. Therefore they have properties which are not easy to produce, in particular not easy to copy, whose presence indicates authenticity, i.e. production by a correspondingly authorized authority. Some important examples for such documents of value are chip cards, coupons, vouchers, checks and in particular bank notes.

In many cases such documents of value are to be machine-examined for their authenticity and/or their physical state, such as for example the limpness or the presence of tears, holes or adhesive tape.

For this purpose in apparatus for processing documents of value sensors are used for examining the documents of value, which sensors within the framework of the present invention are understood to represent devices for detecting at least one property of at least one section of a document of value and for so as to generate sensor signals representing the property. Therein these sensors do not necessarily need to contain a circuit for processing the detection signals or for control.

These sensors typically have at least one electrical component serving to convert electrical energy into sound waves and/or magnetic or electromagnetic fields, in particular optical radiation, for examining the document of value and/or to detect sound waves and/or magnetic or electromagnetic fields, particularly optical radiation, from the document of value, so as to generate detection signals. In the first case the sensor frequently also encompasses a detection element for detecting effects triggered by the influence of the sound waves and/or magnetic or electromagnetic fields. To be supplied with electrical energy or to exchange signals the components are as a rule connected to a conductor plate, on which plug-in connector contacts are disposed for a connecting cable having a complementary plug-in connector and leading to an electrical evaluation circuit. The respective component is as a rule held in a holder in a position which is expedient for examining documents of value, and is connected with the separate conductor plate via cable.

Since such sensors are frequently used in apparatus for automatically processing documents of value, they should be as small as possible and be producible at a small effort. However, the above-described structure of a sensor requires a number of mounting steps and also considerable space.

SUMMARY

It is therefore the object of the present invention to provide a sensor for examining a document of value allowing a simple and compact construction type, and to provide a corresponding method for producing it.

The object is solved by a sensor for examining a document of value in a detection range of the sensor with at least one electrical component for converting electrical energy into sound waves for examining the document of value and/or for detecting sound waves and/or magnetic fields from the document of value, so as to generate detection signals, and a holder for the component having a recess or a hole for at least partially accommodating the component, in which the component is held, and on or in which at least one conductive path extends with which at least one electrical contact of the electrical component is contacted.

The objective is furthermore solved by a method for mounting an electrical component for converting electrical energy into sound waves for examining the document of value and/or for detecting sound waves and/or magnetic fields from the document of value, so as to generate detection signals, in a recess or a hole in a holder, in which the component is inserted at least partially in the recess or the hole and at least one electrical contact of the electrical component is contacted with a conductive path on or in the holder.

Preferred embodiments and further developments are described in the description, the claims and the drawings.

The electrical component can in particular be an emission element for sound waves or electromagnetic waves, particularly radiation in the range of optical radiation, or a corresponding receiving element.

The inventive sensor is particularly characterized by the holder which fulfills at least two functions at the same time: On the one hand it serves to hold the at least one component, on the other hand it represents at least one contact for the component, so that no additional conductor plate is required besides the holder for the component. This allows for a very compact structure and simultaneously, through the reduced number of components, also for simplified mounting. The conductive path can in particular be connected to a plug-in connector, via which the component or the complete sensor can be connected with external units.

Furthermore the component is arranged at least partially in the recess or the hole in the holder, thus in particular partially lowered into it. This means that at least one portion of the component, which does not exclusively comprise the contact elements of the component, is disposed in the recess or the hole. This has the further advantage that a more stable support of the component is possible and the component, in particular if it is completely lowered into the recess or the hole, can be protected in a better way against external mechanical influences.

The holder can in principle have several components. However, preferably the holder is of a single-piece design. The single-piece design facilitates the production of the holder in particular. In the case of a single-piece design the holder does not have to encompass only one layer, but can also have a multilayer structure.

The holder can in principle be produced of any desired material by means of which the functional requirements of the holder can be fulfilled. Preferably the material is chosen in connection with the shape of the holder so that the holder is stiff, i.e. is not or only very slightly deformed by the influence of occurring during normal use.

In a very simple variant the holder can encompass cross-linked polymeric materials, in particular resins, or composite materials thereof. Thus for example classical circuit boards, in particular with thicknesses between 2 mm and 10 mm, preferably 4 mm and 8 mm, for example of Pertinax or glass fiber mats impregnated with epoxy resin or epoxy resin fortified with glass fiber mats (for example FR4) can be used. Such holders can be machined very easily using classical material machining methods such as milling and/or drilling.

In a different preferred embodiment the holder comprises at least one layer of a ceramic material. The use of ceramic materials offers the advantage that these are highly thermally stable and show a good mechanical stability. Preferably as ceramic material a material with good heat-conducting properties, for example aluminum oxide, or a material with high heat-conducting properties, for example aluminum nitride, is used. Thereby any heat possibly produced by the component can be readily conducted away from it.

In a preferred embodiment of the sensor the holder is an injection-molded or transfer-molded component or comprises at least one injection-molded or transfer-molded component. According to the method the holder is correspondingly produced using injection molding or transfer molding. This embodiment has the advantage that the holder can be produced very simply also in the case of complicated geometries. A particularly simple production results in the case that the surface of the holder is free of undercuts. The injection-molded component can be made of at least one thermoplastic material. However, also other polymeric materials or mixtures of materials suitable for injection molding or transfer molding can be used. Preferably such polymeric materials are used which can also be metalized for applying or inserting the conductive path. As polymeric materials particularly technical plastics come into question, such as for example polyamides, polyesters, polyether ketones, polyetheretherketones, polyoxymethylene, liquid-crystalline polymers or, in particular in the case of an optical sensor, transparent polymers such as polycarbonates.

The holder can in principle have any desired shape. However, if several components are arranged as a field, it is preferred that the holder in its basic form is of a plate-shaped design. This means in particular that the holder can be designed as a plate with at least one recess or one hole. This embodiment allows for a particularly easy production of the holder particularly from the above-mentioned materials.

In principle the conductive path can be provided on one of two opposing surfaces of the holder. However, for the protection of the conductive path it is preferred that the conductive path is arranged on a surface of the holder which points away from the document of value during an examination or points away from an emission surface or reception surface of the component. The emission surface or reception surface of the component means the surface of the component on which in the case of emission the coupling out or in the case of reception the coupling in of the waves or of the fields into the component takes place.

In the case that the component is to be protected only mechanically, it can be arranged in the recess or the hole in any desired fashion. However, a particular advantage results if in the sensor the component is oriented relative to the holder by means of at least one surface section of a wall forming the recess or the hole and/or an orientation structure of the holders wall. The holder can then assume a third function, namely that of orienting the component. Conductor plates according to the state of the art at best allow for arranging a component in a surface, but not to orient it in space with any good exactness.

The surface section can be a smooth section of the recess's or the hole's surface, in the case of a cylindrical hole a cylindrical section, at which the component is supported or between which it is clamped or pressed. However, a particularly good orientation can be achieved if the wall of the recess or of the hole features the orientation structure by means of which the component is oriented relative to the holder. By such an orientation structure a particularly exact orientation can take place, which for example in the case of a cylindrical hole does not necessarily have to extend in the direction of the hole's axis. Furthermore the orientation structure and the component can be designed so that they are adjusted to each other, thereby achieving a particularly good fit.

In particular in the sensor the surface section or the orientation structure and the component can be designed in such a way that the component with a main emission direction or a main reception direction is inclined relative to the surface of the holder. In order to render such a design possible, the recess or the hole has to be designed accordingly. This is valid analogously in the case that an orientation structure is given. Despite the possible simplicity of the holder this embodiment allows an exact orientation of the component relative to the holder in any desired direction.

The orientation structure can be designed in a variety of ways. It can for example have a guiding element, allowing both the orientation of the component in space and a rotational position around the main emission direction or the main reception direction. It can for example be a shoulder, a groove or a tongue extending along a direction in which the component is inserted in the recess or the hole.

It is particularly preferred that the orientation structure has a shoulder or a groove extending around the recess or the hole. This embodiment has the advantage that the shoulder or the groove can fulfill two functions, namely on the one hand a positioning within the recess or the hole in a direction in which the component is inserted in the recess or the hole, and on the other hand an orientation.

In principle the recess or the hole can be provided only on one surface of the holder, as is the case with a blind hole for example. However, special advantages can be offered by an embodiment in which the recess or the hole forms a duct extending through the holder. This embodiment allows for arranging the component in the duct in such a fashion that it can be contacted in one direction of the duct and can emit or receive in the other direction. In particular the duct can be formed by a through hole extending through the holder.

For producing the holder it is particularly advantageous if the recess or the hole is provided rotation-symmetrically around an axis predetermined in its position relative to the holder. Such recesses or holes can namely be produced in a particularly simple manner for example by drilling or milling.

The hole or the recess can in principle be provided in any desired shape. In a particularly preferred embodiment the recess or the hole is inclined in relation to a surface of the holder. This allows for arranging and orienting the component in a particularly easy and exact fashion in a position relative to the holder that is also inclined relative to the surface.

The component does not necessarily have to be oriented by means of an orienting structure. In a different particularly preferred embodiment the recess or the hole has a bottom on which the component is arranged that is inclined relative to the surface of the holder. Also in this way a simple orientation of the component relative to the holder can take place.

In principle it is sufficient that the component is arranged at least partially in the recess or the hole, wherein between the inside surface of the holder constituted by the recess or the hole and the component some empty spaces can be given. In particular in the case that the electrical contact of the component is arranged in the recess or the hole it is preferred in the sensor that the component is embedded or cast at least partially in the recess or the hole. This allows for a more stable holding of the component in the recess or hole and, provided that a suitable embedding or casting material is chosen, some protection against humidity, oils or other substances or materials with harmful effects. Furthermore a suitably chosen material can advantageously be chosen so that it has a vibration-reducing effect. Such a reduction of vibration is in particular advantageous if the electrical component is an electroacoustic component such as a sound emitter or a sound receiver. As casting material in particular a flexible, preferably elastic, material can be used, which is suitable to prevent an occurrence of cracks or tears which occur due to temperature-related changes of the extension of the holder and the component. Furthermore preferably electrically isolating casting or embedding materials are used. Corresponding materials, for example gels, are known to the person skilled in the art.

As already described, the holder can have more than one layer besides the conductive path. Preferably an electrically conductive shielding layer is provided on one surface of the holder or within the holder.

This embodiment has the advantage that the shielding layer can shield against electromagnetic fields, so that the component can be protected at least partly against electromagnetic disturbances from the surroundings. Thereby any interference with the function and in particular also with the signal-noise ratio by external electromagnetic fields can be strongly reduced. Accordingly the holder assumes a further function. Particularly in this case it is preferred that the component is arranged with a portion that is sensitive to electrical or electromagnetic fields in the recess or the hole. This particular portion is thus shielded well. The shielding layer preferably also consists of a metal or a metal alloy. The shielding layer can furthermore have a contact by means of which the shielding layer can be connected to ground potential, in order to improve the shielding effect.

In a particularly preferable embodiment the shielding layer contains soft magnetic material, so that also magnetic fields can be shielded off.

Generally the shielding layer does not need to extend across the complete surface of the holder; it is thus possible that recesses are provided in this layer, however which should not strongly interfere with the shielding effect.

In principle the electrical component of the sensor can be chosen at will, as long as it fulfills the mentioned functions.

However, an embodiment of the sensor is particularly preferred in which the component comprises an ultrasonic converter. The ultrasonic converter therein can serve as emitter and/or receiver for ultrasonic waves. In this case the arrangement of the converter in the recess or the hole, provided that the latter is of a suitable design, can also have the side effect of an improved concentration of the emitted ultrasound.

As a further alternative the component can comprise a sensor element for the size and/or the direction of magnetic fields or the magnetic flux. Examples for such construction elements are Hall sensors, magneto-resistive sensor elements or GMR sensor elements.

The electrical contact of the component can in principle be electrically contacted directly or indirectly with the conductive path in any desired fashion.

In a preferred variant the component is contacted with the conductive path by means of a wire. This can be a simple soldered connection or a connection established through wire bonding. This embodiment offers the advantage that for example changes of position or dimension of the component relative to the holder occurring when the sensor is heated can be simply compensated by the wire. Furthermore components which are contacted with wires are very easily available.

In a different embodiment the holder can have a plug-in contact or clip-on contact electrically connected to the conductive path, and the component can have a complementary plug-in contact or clip-on contact plugged into or clipped on the plug-in contact or clip-on contact of the holder. This embodiment offers the advantage that for contacting with the conductive path the component only needs to be plugged, which can substantially facilitate mounting.

In another different embodiment the component can be designed as an SMD and can be directly electrically connected with the conductive path. This allows for a fast and reliable contacting of the component.

The sensor does not have to have one component only, which is held in the holder. Rather, the sensor preferably has a further component for converting electrical energy into sound waves and/or electrical or electromagnetic fields, in particular optical radiation, for examining the document of value and/or for detecting sound waves and/or magnetic or electromagnetic fields, in particular optical radiation, from the document of value, so as to generate detection signals, and the holder has at least one further recess or one further hole in which the further component is arranged at least partially, as well as a further conductive path with which at least one electrical contact of the electrical component of the further component is contacted.

With reference to the further component and/or the further recess or the further hole, for the sensor at least one or several of the embodiments mentioned above or in the following can be taken over regarding the component and the recess or the hole, wherein the embodiment can differ with reference to the construction element or the recess or the hole from the embodiment regarding the further construction element or the further recess or the further hole. This embodiment among other things offers the advantage that an orientation of the component and of the further component relative to each other and to the holder can take place in a simple and very exact fashion. It can in particular be achieved that an additional adjustment of the two components to each other or relative to each other is not necessary.

For example an embodiment of the sensor is particularly preferred in which the at least one component is designed as an emitter with a direction-dependent emission characteristic, and a further component with a direction-dependent receiving characteristic is arranged at least partially in a further recess or a further hole in the holder and is contacted with a further conductive path in or on the holder, wherein the components are held relative to each other in such a fashion that upon examining a document of value the receiver can receive at least approximately the highest intensity. This sensor with a very simple and compact structure allows for examining a document of value in diffuse reflection or reflection with a great exactness of orientation.

In principle the sensor only has to have the holder including the conductive path and the component which is contacted with the conductive path and is arranged at least partially in the recess or the hole. However, the sensor preferably has an electrical circuit for controlling the component or for processing signals of the sensor. A particularly compact structure is yielded if the electrical circuit for controlling the component or for processing signals of the component is arranged on the holder and connected to the conductive path. The circuit can be an analog or digital or mixed analog-digital circuit, which can in particular also have a microprocessor or microcontroller. In addition to the compact construction type the very short connection between the component and the circuit also results in a particularly low sensitivity to electrical or electromagnetic interference fields. In the case that in recesses or holes in the holder several components of the same type are held, the conductive paths preferably each have a length which diverts less than 10% from the average value of the lengths of the conductive paths. In this fashion running-time differences for signals from the components can be reduced in a simple way. A particularly simple arrangement furthermore results if the circuit is provided on a chip.

A preferred further development of the sensor is characterized in that the holder has at least one fastening element for fastening the holder to an apparatus. In the simplest case these can be holes in a plate-shaped holder, however, for example in the case of an embodiment as an injection-molded component, it is possible to use an element for a snap-on connection or lock-home connection as fastening element. This has the advantage that the holder can be mounted without tools in a simple fashion.

The inventive sensors can be used particularly advantageously in apparatus for processing documents of value. Therefore the object of the invention is also an apparatus for processing documents of value for processing documents of value with an inventive sensor. Preferably the apparatus for processing documents of value has a transport device for transporting documents of value to the sensor, in particular into or through the detection range of the sensor, and for transporting documents away from the sensor, more exactly out of the detection range of the sensor.

The object of the invention is also a sensor for examining a document of value in a detection range of the sensor, in particular an optical sensor, with at least one electrical component for converting electrical energy into electromagnetic fields, in particular optical radiation, for examining the document of value and/or for detecting electromagnetic fields, in particular optical radiation, from the document of value, so as to generate detection signals, and a holder for the component having a recess or a hole for at least partially accommodating the component, in which the electrical component is held, and on or in which at least one conductive path extends with which at least one electrical contact of the electrical component is contacted.

A further object of the invention is a method for mounting an electrical component for converting electrical energy into electromagnetic fields, in particular optical radiation, for examining the document of value and/or for detecting electromagnetic fields, in particular optical radiation, from the document of value, so as to generate detection signals, in a recess or a hole in a holder, in which the component is inserted at least partially in the recess or the hole and at least one electrical contact of the electrical component is contacted with a conductive path on or in the holder.

The component can comprise a source for optical radiation. The optical radiation emitted by the source can then be used for examining the document of value. As sources for optical radiation in particular semiconductor construction elements come into question, such as light-emitting diodes or laser diodes or light-emitting diodes on the basis of organic materials, such as for example OLED. Such sources have the advantage that in comparison to the radiation efficiency they develop only little waste heat.

In this embodiment it is then particularly preferred that the holder is transparent in at least a predetermined spectral range at least in the area of the component for the radiation of the source, and in this area has an optical system for influencing the optical radiation emitted by the source. This embodiment has the advantage that the holder can assume a further, optical function. This embodiment allows to provide in a simple fashion a radiation source with a precisely oriented beam or bundle of beams. The optical system can in particular be integrated in a single-piece holder. For example the holder with optical system can be formed as an injection-molded part of a suitable polymer, for example polycarbonate. Furthermore an adjustment of the construction element and the optical system relative to each other can be strongly facilitated, if not rendered completely superfluous.

The component can furthermore comprise a photo-detection element. The corresponding part of the sensor can then serve as receiver for optical radiation.

Corresponding to the embodiment described directly above, the holder can be transparent in at least a predetermined spectral range at least in the area of the component for the radiation to be detected, and in this area can have an optical system for focusing the optical radiation to be detected onto the photo-detection element. This embodiment offers similar advantages as described above. Therein the spectral range for the radiation to be detected can be predetermined in dependence on the type or the kind of the document of value to be examined and, if required, the type of radiation for illuminating the document of value.

Alternatively or additionally in this sensor the holder can have a holding portion for an optical construction element. As optical construction elements in particular diffraction gratings and other diffractive optical construction elements or filters can be used.

According to another preferred embodiment at least in the area of the component the holder can be designed as a filter or a diffractive construction element for the radiation from or to the component. The filter can in particular be designed as an interference filter or as a simple colored layer. The diffractive construction element can be formed by structuring the surface of the holder or by applying a corresponding diffractive structure, for example of metal, on the surface of the holder. Its production being simple, this embodiment also offers a very compact construction type, in which in particular no adjustment between the component and the optical construction element is necessary.

Further preferred embodiments and further developments for the optical sensor are the embodiments described for the sensor mentioned first.

BRIEF DESCRIPTION OF THE DRAWINGS

In the following the invention will be explained in greater detail with reference to the drawings. The figures are described as follows.

DETAILED DESCRIPTION OF VARIOUS EMBODIMENTS OF THE DISCLOSURE

Figure 1:
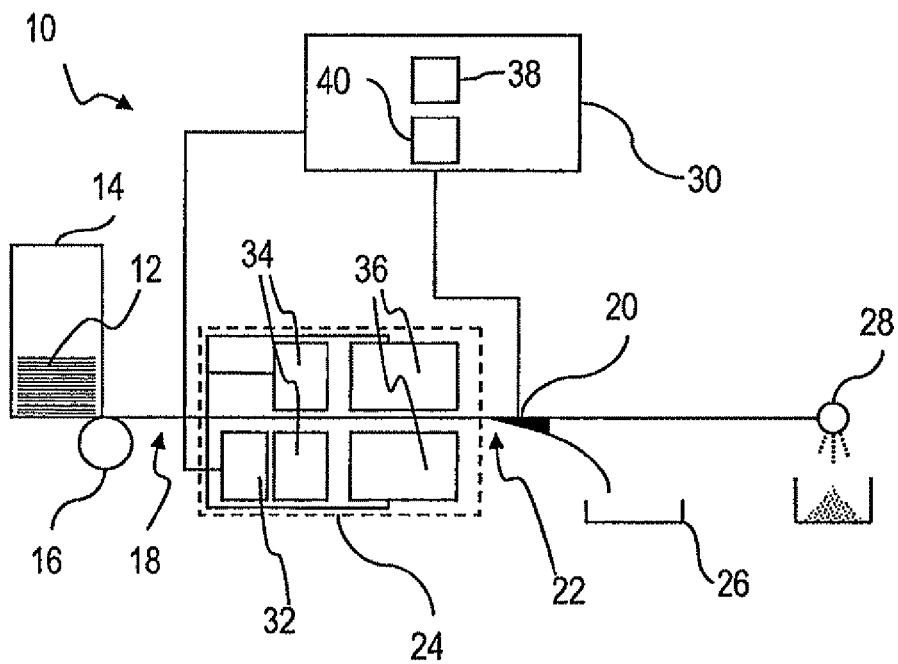
FIG. 1 a schematic view of an apparatus for processing bank notes.

FIG. 1 shows an apparatus 10 for determining a state of documents of value, in the example an apparatus for processing bank notes, which serves, among other things, for determining the state of documents of value 12 in the form of bank notes. The apparatus 10 has an input pocket 14 for inputting documents of value 12 to be processed, a singler 16 which can take hold of documents of value 12 in the input pocket 14, a transport device 18 with a switch 20, and downstream of the switch 20 an output pocket 26 and a shredder 28 for destroying documents of value or bank notes. Along a transport path 22 provided by the transport device 18 upstream of the switch 20 and downstream of the singler 16 a sensor arrangement 24 is arranged, serving for detecting properties of documents of value 12 fed in a singled state and for generating sensor signals representing the properties. A control and evaluation device 30 is connected at least with the sensor arrangement 24 and the switch 20 via signal connections and serves to evaluate sensor signals of the sensor arrangement 24 and controlling at least the switch 20 in dependence of the result of the evaluation of the sensor signals.

For this purpose the sensor arrangement 24 comprises at least one sensor; in this embodiment three sensors are provided, namely a first sensor 32, in the example an optical sensor for detecting color properties, which detects optical radiation remitted by the document of value, a second sensor 34, in the example also an optical sensor for detecting special spectral security features of the documents of value, which detects optical radiation transmitted by the document of value, and a third sensor 36, in the example an acoustic sensor, more exactly an ultrasound sensor, which detects ultrasonic signals coming from the document of value, in particular transmitted by it.

While a document of value 12 is transported past, the sensors 32, 34 and 36 corresponding to their function detect properties of scanning areas on the document of value predetermined by the position of the sensors relative to the document of value, wherein corresponding sensor signals are generated. Therein each sensor can have a different spatial resolution, i.e. the size and distribution of the detected scanning areas on the document of value can vary in dependence on the respective sensor and the transport speed used. To each of the scanning areas a location is allocated which represents the position of the scanning areas for the respective sensor relative to each other and/or relative to the document of value.

On the basis of the analog or digital sensor signals of the sensors 32, 34, 36 the control and evaluation device 30 determines in the evaluation of the sensor signals at least one property of at least one scanning area and/or at least one property of the document of value, which are relevant for checking the bank notes in regard of their state. Preferably several such properties are determined. Furthermore by means of the signals of the sensor 34 the authenticity of the documents of value is checked. The properties of the documents of value characterize the state of the documents of value, in this example the state of the bank notes regarding the marketability or fitness for circulation, i.e. the fitness for being used further on as a means of payment. As corresponding properties of documents of value in this example particularly the presence of soiling or spots, as well as the presence of tears, adhesive tape, dog ears and/or holes, and/or the absence of parts of the documents of value. These properties of documents of value can be determined in dependence on sensor signals of only one of the sensors or at least two of the sensors.

In addition to corresponding interfaces for the sensors the control- and evaluation device 30 for this purpose particularly also has a processor 38 and a memory 40 connected to the processor 38, in which at least one computer program with program code is stored, upon the execution of which the processor 38 controls the apparatus or evaluates the sensor signals, in particular for determining an overall state of an examined document of value, and activates the transport device 18 in accordance with the evaluation.

In particular the control- and evaluation device 30, more exactly the processor 38 therein, upon determining the properties of the document of value can check a criterion for the overall state of the document of value, in which at least one of the properties of the document of value is considered or which depends on at least one of the properties of the document of value. In the criterion in particular further reference data for determining a still admissible state of the document of value can be considered, which are predetermined and stored in the memory 40. The overall state can for example be given by two categories "still fit for circulation" or "marketable" or "to be destroyed". In dependence on the determined state the control- and evaluation device 30, in particular the processor 38 therein, activates the transport device 18, more exactly the switch 20, in such a fashion that, corresponding to its determined overall state, the checked document of value is transported into the output pocket 26 or to the shredder 28 to be destroyed.

For processing documents of value 12, documents of value 12 inserted in the input pocket 14 in the form of a stack or individually, are singled by the singler 16, and are forwarded in a singled state to the transport device 18, which forwards the singled documents of value 12 to the sensor arrangement 24. This detects at least one property of the documents of value 12, wherein sensor signals are generated which represent the property of the document of value. The control- and evaluation device 30 detects the sensor signals, in dependence on these determines a state of the respective document of value, and in dependence on the result activates the switch 20 in such a fashion that for example documents of value which are still usable are forwarded to the output pocket 26 and documents of value which are to be destroyed are forwarded to the shredder 28 to be destroyed.

Pieces of adhesive tape on the documents of value 12 can for example be detected by means of the sensor 36. To characterize the state of the bank notes the control- and evaluation device 30 for this purpose can for example determine the number of pieces of adhesive tape or the total length or total surface of the adhesive tape on the basis of the sensor signals of the sensor 36.

To determine the overall state of the bank notes the control- and evaluation device 30 uses the already mentioned criterion in which at least one of the properties can be considered. The individual values can preferably for example be combined in a criterion, for example by means of a linear combination.

Then, for determining the overall state of the bank notes, the control- and evaluation device 30 compares the linear combination of the properties characterizing the state of the bank notes with a predetermined value and decides for example whether the state of the bank notes is good or bad, i.e. whether they are fit for circulation or not. It is thus achieved that a bank note, on which considerable soiling is already given, but which soiling on its own would not yet lead to the bank note's state to be determined as bad, is determined as bad if the bank note has additionally e.g. only a small number of spots and/or tears, etc.

The ultrasound sensor 36, a sensor according to a first preferred embodiment of the invention, is shown partly in greater detail in the FIGS. 2 to 5.

Figure 2:
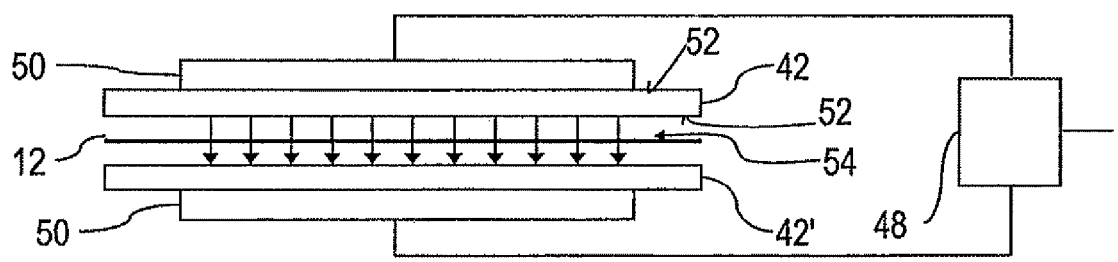
FIG. 2 a schematic lateral view of a first ultrasound sensor of the apparatus for processing bank notes in FIG. 1, FIG. 3 a schematic top view of a holder of the ultrasound sensor and ultrasonic converters held therein, FIG. 4 a schematic view from below of the holder in FIG. 3, FIG. 5 a schematic view of a section through a portion of the holder in FIG. 3 along a plane orthogonally onto a surface of the holder, FIG. 6 a schematic view of a section through a portion of a holder of a second ultrasound sensor, FIG. 7 a schematic top view of a holder of a third ultrasound sensor with ultrasonic converters held therein, FIG. 8 a schematic view of a section through a portion of a holder of a fourth ultrasound sensor, FIG. 9 a schematic view of a section through a portion of a holder of a fifth ultrasound sensor, FIG. 10 a schematic view of a portion of a sixth ultrasound sensor, FIG. 11 a schematic view of a section through a portion of a holder of the sixth ultrasound sensor in FIG. 10, FIG. 12 a schematic view of a section through a portion of a holder of a further ultrasound sensor corresponding to FIG. 3, FIG. 13 a schematic view of a section through a portion of a holder for light-emitting diodes of a first optical sensor, FIG. 14 a schematic view of a portion of a second optical sensor, FIG. 15 a schematic view of a section through a portion of a holder for light-emitting diodes of the second optical sensor, and FIG. 16 a schematic view of a section through a portion of a holder for a GMR sensor element of a magnetic sensor.

The ultrasound sensor 36 has two holders 42 and 42' having the same design except that they are mirrored on a plane orthogonal to their surface, and each having conductive paths 44 on one side and in which ultrasonic converters 46 are held which are contacted with the conductive paths 44, as well as a control- and signal-processing device 48 connected via electrical connections with plug-in connectors 50 with the conductive paths 44 on the holders 42, 42' and, not shown in FIG. 2, with the control- and evaluation device 30 for exchanging signals and for current supply.

The holders 42 and 42' in their basic shape are of a plate-shaped design and are arranged with their plate surfaces 52 parallel to each other, so that these coincide in a direction orthogonal to the plate surfaces 52. Through a feed area 54 formed between the holders 42 and 42' extends the transport path 22, so that documents of value 12 transported through the feeding area can be examined by means of ultrasound.

The ultrasonic converters 46 in the holder 42 are used or activated as ultrasound emitters for this purpose, while the ultrasonic converters 46 in the holder 42' serve as receivers for ultrasound, which has penetrated a document of value 12 or is radiated by the same. Upon detecting ultrasound the ultrasonic converters serving as receivers emit corresponding detection signals. As illustrated in FIG. 2, the ultrasonic converters 46 are arranged in such a fashion that the ultrasound paths established between emitters and receiver extend in good approximation orthogonally to the document of value 12 or the plate surfaces 52.

Figure 3:
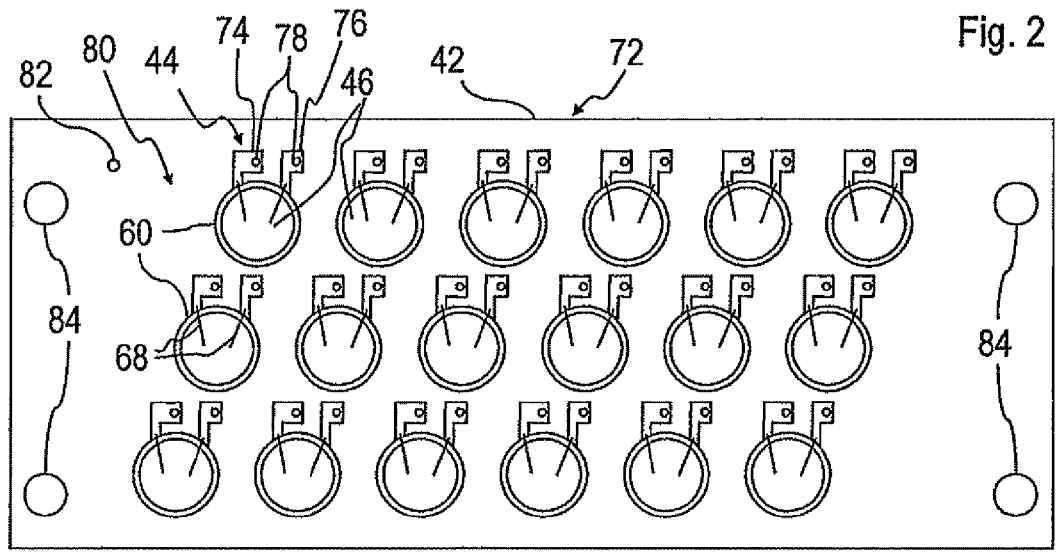
Figure 4:
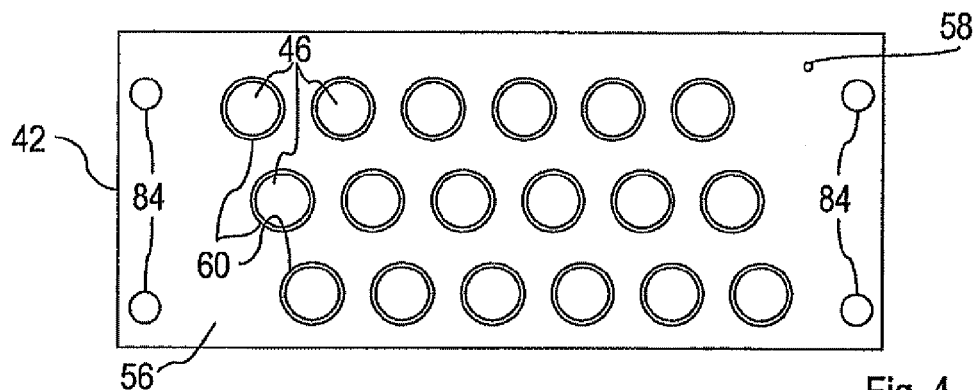

The holder 42 which, as already described, is designed like the holder 42' except for the mirroring, is shown in greater detail in the FIGS. 3 and 4.

The holder 42 in this embodiment is designed as a conductor plate of a glass-fiber reinforced synthetic resin having a thickness of 8 mm.

Furthermore the holder 42 on the side of the plate surface of the holder 42 illustrated in FIG. 4, hereinafter referred to as sample side for the sake of simplicity, has a shielding layer or shielding lamination 56 of an electrically conductive material, in the example a metal such as copper, covering the complete surface. In this shielding layer 56 a connection area 58 is provided, via which the shielding layer 56 can be connected to a ground lead. The sample side of the holder is the side of the holder on which the document of value to be examined is disposed during the examination.

In the holder 42 through holes 60 are provided in three rows offset from each other and respectively equally spaced apart, the holes equaling each other, extending orthogonally to the plate surfaces 52 of the holder 42 and forming ducts which serve to hold the ultrasonic converters 46. Through the above-described arrangement of the holders 42 and 42' relative to each other the holes in the holders 42 are aligned with those of the holes in the holder 42'.

Figure 5:
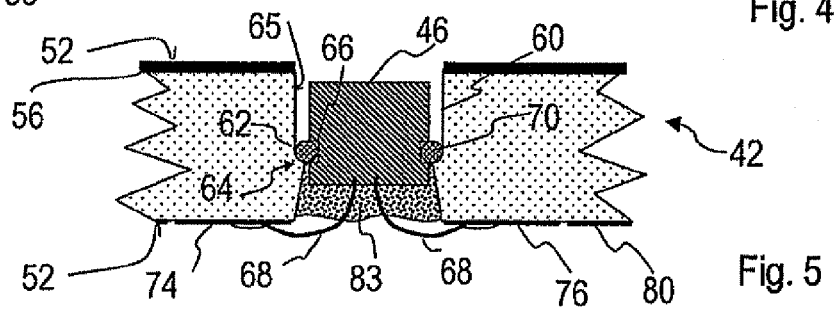

A cross section through the holder 42 in the area of one of the holes is shown schematically in FIG. 5. The other corresponding portions of the holder 42 are designed equally.

Each hole 60 has two portions with different diameters, of which the portion opening to the sample side has the larger diameter. Thereby an orientation structure 64 in the form of a shoulder extending in a ring shape is formed in a middle section 62 on an inside surface or wall 65 of the holder 42 forming the hole 56.

The ultrasonic converter 46 which is cylindrical in the example has a holding groove 66 along its perimeter. Furthermore, on its front side pointing away from the sample side it has two electrical contacts 68, in the example connecting wires, to directly or indirectly electrically connect the ultrasonic converter 42 with the control- and signal-processing device 48.

The ultrasonic converter 46 is oriented via a holding element, in the example a circular ring 70 of an elastic, preferably sound-absorbing material which is inserted in the holding groove 66 in a pre-tensioned fashion, on the orientation structure or shoulder 64 in a direction predetermined by the position of the shoulder 64 and the position of the holding groove 66 relative to the holder 42, in the example in the FIGS. 2 to 5 in a direction at least approximately orthogonal to the plate surfaces 52. This results in a corresponding orientation of the reception or emission characteristic (sensitivity) relative to the holder 42; the maximum lies approximately in a direction at least approximately orthogonal to the plate surfaces 52. Thereby in the shown arrangement of the holders 42 and 42' the emission and reception characteristics of the ultrasonic converters of respectively one ultrasound path are adjusted to each other exactly.

The coupling in or out of the ultrasound tales place substantially via a radiation or reception surface of the converter, which extends parallel to the surface of the holder on the sample side, i.e. is arranged in an upward direction in FIG. 3.

On the plate surface opposite the sample side the conductive paths 44 or conductive path structures 72 are provided in a conductive path layer of a suitable metal or a suitable metal alloy. In FIG. 3 the areas of the surface are indicated by the black lines in which the conductive path layer is not present and which consequently constitute isolating areas. For each of the holes 60 or each of the components 42 in the form of the ultrasonic converters, by the conductive path structures 72 two conductive paths 74 and 76 are provided, which have contacting areas on the edge of the respective hole for electrically contacting the contacts 68 of the respective component 42, here ultrasound sensors. In this example the contacts of the ultrasonic converter are contacted with the conductive paths 74 and 76 through soldered connections.

On the other ends of the conductive paths 74 and 76 also contact areas are provided, into which plug-in contact elements 78, in the example sockets, are pressed, into which corresponding complementary plug-in contact elements in the plug-in connectors 50, in the example plug-in contact pins, can be inserted. Through this design of the holder 42 a separate connection conductor plate can be omitted.

The conductive paths 74 and 76 are approximately equally short for all ultrasonic converters, so that for all ultrasonic converters approximately the same reduction of interfering signals affecting the conductive paths and consequently the signals transported thereby can be achieved.

The conductive areas between these conductive paths constitute a layered, continuous, electrically conductive shielding structure 80, which, like the shielding layer 56, is provided with a connection 82 for a ground lead.

The conductive paths 74 and 76 are consequently arranged on the surface of the holder which points away from the document of value during an examination and from a radiation- or reception surface of the component, i.e. on the surface pointing downward in FIG. 3.

The holding groove 66 and the portion 62 or the orientation structure 64 in combination with the thickness of the holder 42 are designed in such a fashion that the ultrasonic converter 46 is lowered at least partially, in the example completely, into the hole 60, so that in particular also its electrically sensitive portions such as for example the connecting lines to its piezoelectric element near the contacts 68 for connecting the ultrasonic converter 46 in the holder 42 and thereby, except for a shift in the direction of the plate surfaces, are arranged between the shielding layer 56 and the shielding structure 80. Thereby parts of the contacts 68 and the ultrasonic converter 42, in particular its electrically sensitive portion, are well shielded against electrical and electromagnetic fields outside the holder 42.

Furthermore the ultrasonic converters 46, by lowering them into the holes 60, are well protected against mechanical impacts in a direction parallel to the plate surfaces.

In addition, provided they are of a suitable design, the ducts formed by the holes can also have a positive influence on the radiation- or reception characteristic of the ultrasonic converters.

As an optional feature for protecting the contacts 68 against mechanical and chemical influences and for the further mechanical support of the ultrasonic converter 42 in the hole 60, the area of the hole 60 from the ultrasonic converter 42 up to the plate surface 58 with the conductive path structures is cast with a polymeric material 83, which is electrically isolating and elastic to at least such an extent that it can compensate differences in the dimensional changes of the ultrasonic converters and the holes caused by temperature fluctuations. This material is not shown in FIG. 3 for the sake of clarity.

Finally the holder 42 has fastening holes 84 for fastening it in the apparatus for processing documents of value.

It is a further advantage of the holder that the mounting of the ultrasonic converters is very simple. For mounting the electrical component, in the example the ultrasonic converter, it is inserted in the hole 60 after slipping over the circular ring 70 and moving the latter into the holding groove 66, so that the circular ring 70 rests against the orientation structure. The diameter of the hole 42 and the shoulder 60 and the diameter and cross section of the circular ring 70 are chosen in such a manner in dependence on the diameter of the ultrasonic converter 42 that the ultrasonic converter in this position is held in a force fit. Afterwards the electrical contacts 68 of the electrical component or the ultrasonic converter 42 are contacted with the corresponding conductive paths 74 and 76 on the holder 42, in the example by soldering. The contacting can take place in a very simple fashion, since the respective component is already oriented and positioned relative to the holder 42 and thereby also to the conductive paths 74 and 76.

Subsequently the area between the ultrasonic converter 42 and the plate surface with the conductive paths 44 is cast with the material 83. Therein the circular ring 70 serves as a seal together with the shoulder 60.

This mounting is carried out for both holders 42 and 42' and all ultrasonic converters 42. The holders 42 and 42' are then fastened parallel to each other, with their shielding layers pointing towards each other.

Figure 6:
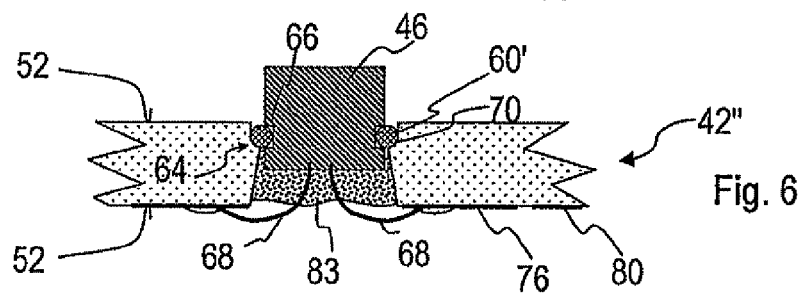

A second embodiment in FIG. 6 differs from the first embodiment only in the design of the holders 42 and 42'.

As can be seen in FIG. 6 in the example of the holder 42" the holders now are not provided with the shielding layer 56 and have a minor thickness, so that the electrical component, in the example the ultrasonic converter 42, is now held only partially in the holder, but is oriented like in the first embodiment. All other features, in particular also the holder, otherwise equal those of the first embodiment. The mounting is also carried out in the same way.

Figure 7:
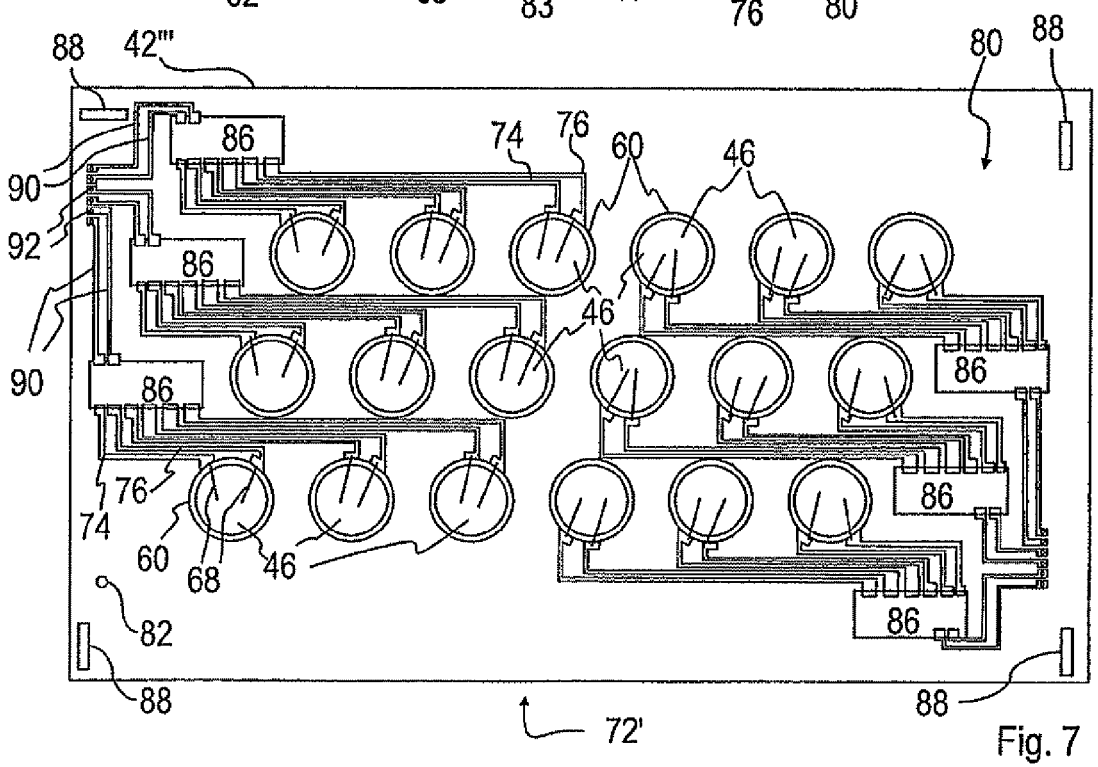

A third embodiment in FIG. 7 differs from the first embodiment again in the design of the holder 42''' with the ultrasonic converters operated as receivers and the design of the control- and signal processing device 48'.

The control- and signal processing device 48' now on the holder 42''' with the ultrasonic converters serving as receivers has signal processing circuits 86, with which respectively three ultrasonic converters 42 are electrically connected and which have amplifying devices for amplifying the signals of the ultrasonic converters 42 connected to them, analog/digital converters for digitizing the amplified signals and a multiplexer for transmitting the digitized, amplified signals from three ultrasonic converters via a connection to a further part of the control- and signal processing device 48' which is not shown in the figures. This part has devices for processing the received signals in the same fashion as in the first embodiment. Apart from this the control- and signal processing device 48' is designed like the control- and signal processing device 48 of the first embodiment.

The holder 42''' consequently differs from the holder 42' or 42 of the last embodiment only in the design of the conductive path structures 72' and the design of the fastening devices, which now instead of the fastening holes 84 comprise slots 88 for snap-in pins, so that the holder can be fastened simply by locking.

In the holder 42''' the rows of the holes 60 are spaced apart from each other somewhat more widely than in the first embodiment, wherein conductive paths 74' and 76' now extend from each of the holes 60 to the signal processing circuits 86.

Furthermore for each of the signal processing circuits 86 two additional conductive paths 90 are provided. The conductive paths 90 are designed in such a fashion that the ends of conductive paths which are not connected to the signal processing circuits 86 and which lead to respectively three signal processing circuits 86 arranged on the one side of the holder, are arranged next to each other and connected with pressed-in plug-in contact elements 92. These serve for establishing a plug-in connection with complementary plug-in contact elements of a plug-in connector on a lead leading to a further part of the control- and signal processing device 48'.

This embodiment has the advantage that the signals of the ultrasonic converters serving as receivers can be directly amplified and digitized on the holder 42''', thereby improving the signal-noise ratio.

Figure 8:
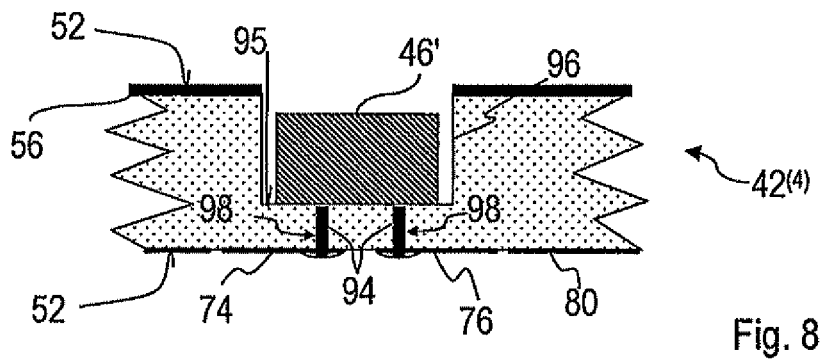

A fourth embodiment in FIG. 8 differs from the first embodiment in the design of the holders $42^{(4)}$ and the ultrasonic converters 46'. Furthermore the ultrasonic converters are not cast, although this is possible in principle.

The ultrasonic converters 46' differ from the ultrasonic converters 46 in that they are now provided with contact pins 94 as electrical contacts, and are designed flat on the front side from which the contact pins 94 protrude.

The holders $42^{(4)}$ differ from the holders 42 and 42' by a reduced thickness and in that now instead of the through holes 60 cylindrical recesses or blind holes 96 are provided, in the bottom 95 of which, in a direction orthogonal to the bottom 95, through borings 98 to the plate surface with the conductive path structures 72 are implemented. The through borings 98 lead to contact areas of the conductive paths 74 and 76.

Otherwise the embodiment does not differ from the first embodiment, so that for the same elements the same reference numerals are used, and the explanations with reference to the first embodiment are valid analogously also here.

The ultrasonic converters 46' can now be pushed through the through borings 98 with the contact pins 94, until their front side rests against the surface of the holder on the bottom 95 of the blind holes 96. This portion of the holder's surface or of the recess consequently serves to orient the ultrasonic converters 46' relative to the holder $42^{(4)}$. In the example the bottoms extend essentially parallel to the plate surfaces 52. The through borings 98 in contrast serve the positioning in the direction of the plate surface 52. The contacting is implemented also here by soldering together the contact pins 94 guided through the through borings 98 with the corresponding areas of the conductive paths 74 and 76. In addition to the advantages of the first embodiment this results in a particularly simple mounting of the ultrasound element.

Figure 9:
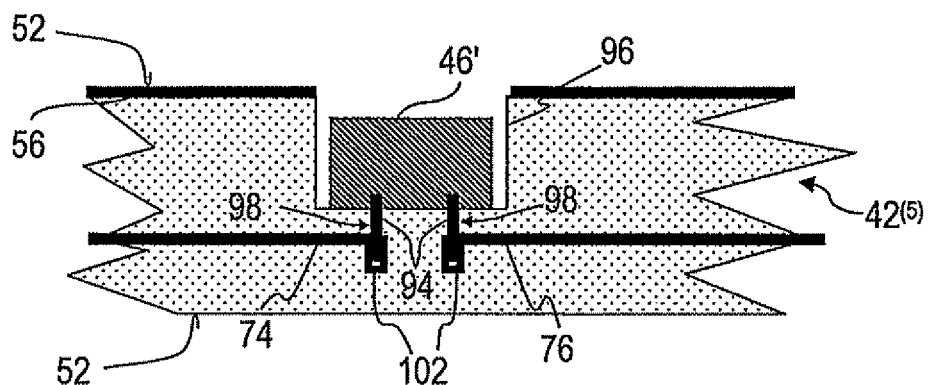

A fifth embodiment partly illustrated in FIG. 9 differs from the fourth embodiment in that the holders $42^{(4)}$ are replaced by holders $42^{(5)}$. All other elements are unchanged, so that the same reference numerals are used for these and the explanations are valid analogously also here.

The holder $42^{(5)}$ differs from the holder $42^{(4)}$ in that it has a multilayer structure. Parallel to the plate surfaces 52 a layer extends in which the conductive path structures 72 are arranged, which are designed as in the first embodiment. In the contact areas of the conductive paths sockets 102, which are aligned with the through borings, are pressed into corresponding holes. The ultrasonic converters 46' can now be contacted by merely inserting them, again facilitating mounting.

Figure 10:
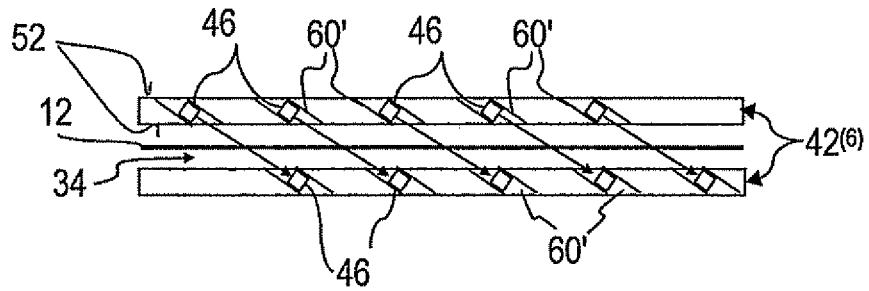
Figure 11:
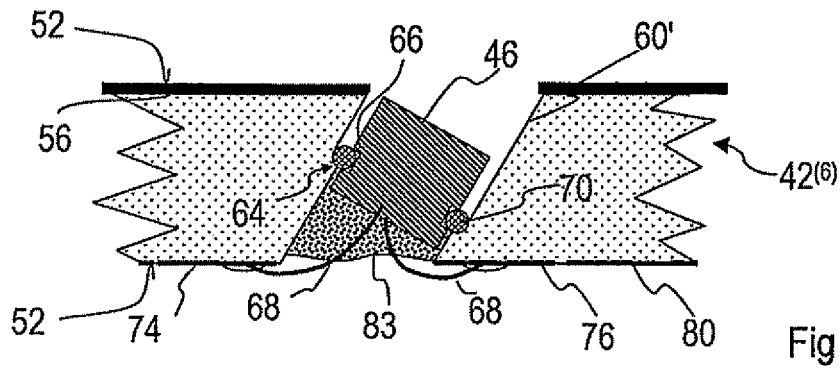

A sixth embodiment in the FIGS. 10 and 11 differs from the first embodiment only in the design of the holders $42^{(6)}$, which differ from the holders 42 in the orientation of the holes 60' and thereby the ultrasonic converters 42. The holes 60' and consequently the ultrasonic converters 46 arranged therein are now inclined in relation to the plate surfaces 52. The contacting of the holders with conductive paths remains unchanged. All other features are designed in accordance with the first embodiment, so that in the FIGS. 10 and 11 the same reference numerals are used and the explanations concerning the unchanged features of the first embodiment are valid also here.

This embodiment has the advantage that between the ultrasonic converters and the document of value to be examined no standing ultrasonic waves or multiply reflected ultrasonic pulses can occur, so that the frequency at which examinations can be carried out can be increased. In this fashion also measurements are possible during which ultrasound can be emitted continuously.

Figure 12:
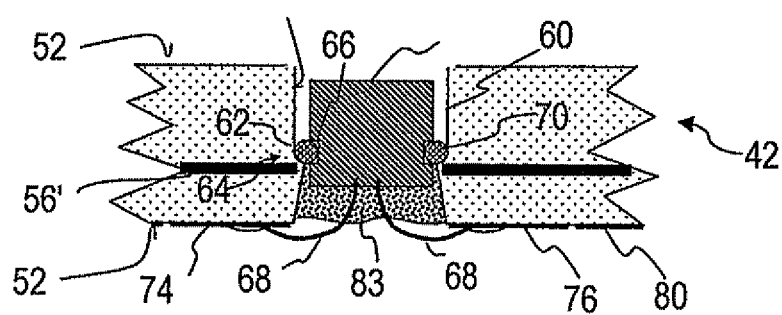

A further embodiment in FIG. 12 differs from the embodiment in FIG. 5 only in the arrangement of the conductive shielding layer 56' which is now arranged within the holder. All other parts of the sensor correspond to those in FIG. 3, so that for these the same reference numerals are use and the explanations concerning these are valid also here.

The layer 56' arranged in the holder 46 can in particular be a Cu layer connected with a not shown connector for a ground connection.

An embodiment for an optical sensor in FIG. 12 differs from the embodiment in FIG. 1 on the one hand in that now an optical sensor is used for examining documents of value in transmission, for example the sensor 34, in which, instead of the ultrasonic converters, semiconductor radiation sources 104, in the example light-emitting diodes, are provided as illumination sources, and photo-detection elements are provided as receivers. On the other hand different holders are used. For unchanged features the same reference numerals are used as in the first embodiment and the explanations concerning this embodiment are valid analogously also here.

The holders $42^{(7)}$ furthermore differ from the holders 42 in that they are injection-molded parts made of a transparent polymer, in the example polycarbonate.

In comparison to the holders 42 and 42' furthermore the shielding layer 56 is missing. Finally the holders $42^{(7)}$ are of a different design than the holders 42 in the area of the holes 60. But otherwise they are equal.

The design of the holders in the area of the holes is described with reference to FIG. 12 for the sake of simplicity. The holder for the photo-detection elements is designed correspondingly.

Instead of the through holes 60 now recesses 106 are provided, from the surface with the conductive paths toward the inside each having a first cylindrical portion and then a second cylindrical portion which are arranged coaxially in relation to each other. Furthermore the diameter of the second portion is smaller than that of the first portion, so that on the surface of the holder or the recess 106 a circumferential shoulder 108 is formed as orientation structure.

The semiconductor radiation source 104 has a base, which in the mounted state rests on the shoulder 108, thereby orienting the semiconductor radiation source 104 relative to the holder $42^{(7)}$, in the example with its main radiation direction orthogonal to the plate surface 52. By way of fastening, this can for example be adhesively bonded.

In the holder $42^{(7)}$ furthermore above every recess a light-collecting optical system 110, in the example a lens, is provided, whose optical axis extends coaxially to the axis of the recess 106. The lens is designed in such a fashion that it bundles the optical radiation of the semiconductor radiation source.

The semiconductor radiation sources 104 are connected via wires 109 as electrical contacts with the contact areas of the conductive paths 74 and 76 by means of a soldered connection.

The holder for the photo-detection elements, except for the mirror-image arrangement of the recesses, differs from the holder for the semiconductor radiation sources in that the optical system 110 is designed so that optical radiation is focused on the respective photo-detection element.

The coupling in or out of the optical radiation takes place substantially via a radiation or reception surface of the converter, which extends parallel to the surface of the holder on the sample side, i.e. is arranged in an upward direction in FIG. 12. The conductive paths are thus arranged on a surface of the holder that points away from the document of value during an examination.

This sensor has, insofar as it has the features of the sensor of the first embodiment, the same advantages and is in particular characterized by a simple and compact structure as well as easy mounting.

Figure 13:
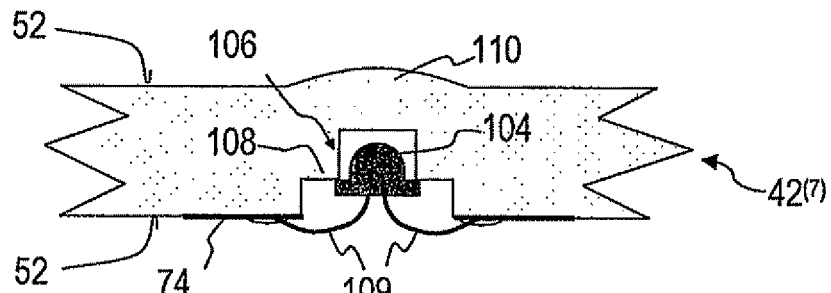
Figure 14:
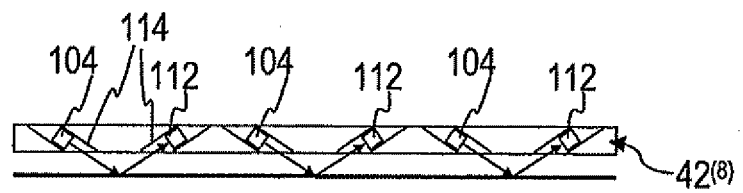
Figure 15:
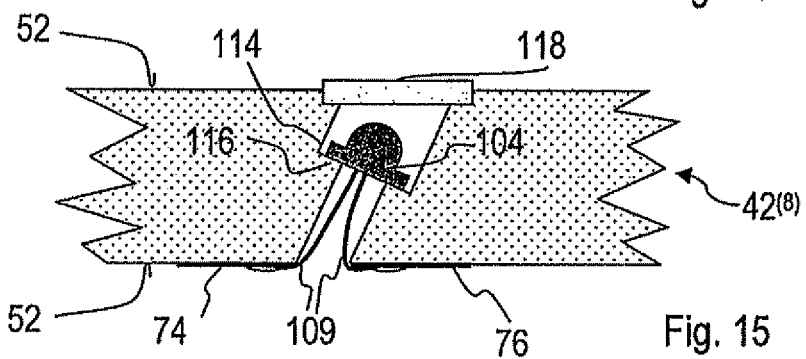
Figure 16:
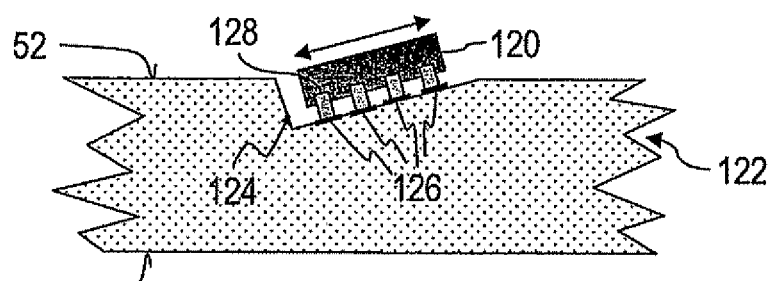

A further embodiment in FIGS. 13 and 14 differs from the preceding embodiment in that the sensor is designed for examination in reflection and therefore has only one holder $42^{(8)}$ in which the semiconductor radiation sources 104 and the photo-detection elements 112 are arranged. For features remaining unchanged in comparison to the seventh embodiment the same reference numerals are used and the explanations concerning this are valid analogously also here.

The holder 42⁽⁸⁾ is designed like the holder 42 in the first embodiment except for the shielding layer 56 which is missing here and the design of the holes 60.

As shown schematically in FIGS. 13 and 14 the holes 114 corresponding to the holes 60 are now inclined with their axes in relation to the plate surfaces 52. The holes 114 therein are arranged in pairs and inclined toward each other and the holder 42⁽⁸⁾ in such a fashion that optical radiation of a semiconductor radiation source 104 in one hole 114 of a pair upon reflection on a document of value 12 in the detection range 54 impinges on the photo-detection element 112 in the second hole of the pair.

The duct-forming through holes 114 again have two cylindrical, coaxially extending portions with different diameters, so that respectively one orientation structure 116 is formed again in the form of a circumferential shoulder. Since the portion of the respective hole 114 opening onto the plate surface 52 with the conductive path structures 72 has the smaller diameter, the shoulder is oriented towards the sample side. The semiconductor radiation source 104 now rests with its base on the orientation structure 116, so that it and thereby its main radiation direction are oriented coaxially to the hole 114.

The contacting takes place like in the preceding embodiment.

The holes 114 on the sample side are each covered by filters 118, by means of which interfering radiation from the surroundings can be filtered out.

This sensor is characterized in that all parts except the control- and signal processing device are arranged and contacted on the holder, so that no adjustment effort is necessary and very simple mounting is provided. Moreover the sensor is very compact and space-saving.

In other embodiments instead of or in addition to the optical system 110 an interference filter, a diffractive optical element or a diffraction grating can be arranged on the holder.

In a further embodiment in FIG. 12 an electrical component 120 for detecting a direction of a magnetic field, in the example a GMR element constituting an SMD, is arranged on a plate-shaped holder 122 in a wedge-shaped recess 124 in such a fashion that it is inclined relative to the holder 122 and is partially arranged in or lowered into the holder 122.

The contacts 128 of the SMD are contacted with corresponding conductive paths 126 of the holder 122.

Also this sensor is characterized by an extremely simple structure and very easy mounting while the electrical component 120 is at the same time oriented relative to the holder 122 in a precise fashion.

The features of the examples can also be exchanged. In particular also in the case of an ultrasound sensor a holder produced by injection molding or transfer molding can be used.

The invention claimed is:

1. A sensor for examining a document of value in a detection range of the sensor comprising
    at least one ultrasonic converter that converts electrical energy into sound waves useable for examining the document of value and/or detecting sound waves from the document, said ultrasonic converter generating detection signals, and
    a holder for the ultrasonic converter, having a recess or a hole that accommodates at least partially the ultrasonic converter and in which the ultrasonic converter is held, and on or in which at least one conductive path extends that contacts at least one electrical contact of the ultrasonic converter.

2. The sensor according to claim 1, wherein the holder is formed in a single-piece.

3. The sensor according to claim 1, wherein said holder is plate-shaped.

4. The sensor according to claim 1, wherein the conductive path is arranged on a surface of the holder which faces away from the document of value during an examination, or faces away from an emission or reception surface of the ultrasonic converter.

5. The sensor according to claim 1, wherein the ultrasonic converter is oriented using at least one surface section of a wall forming the recess or the hole and/or an orientation structure of the wall in relation to the holder.

6. The sensor according to claim 5, wherein the surface section or the orientation structure and the ultrasonic converter are arranged such that a main emission direction or a main reception direction of the ultrasonic converter is inclined in relation to a surface of the holder.

7. The sensor according to claim 4, wherein the orientation structure has a shoulder extending around the recess or the hole or a groove on an inside wall of the recess or of the hole.

8. The sensor according to claim 1, wherein the recess or the hole comprises a duct extending through the holder.

9. The sensor according to claim 1, wherein the recess or the hole is symmetrical about an axis that extends in predetermined relationship relative to the holder.

10. The sensor according to claim 1, wherein the recess or the hole is inclined in relation to a surface of the holder.

11. The sensor according to claim 1, wherein the recess or the hole has a bottom that is inclined in relation to a surface of the holder, said ultrasonic converter being disposed on said bottom.

12. The sensor according to claim 1, wherein the ultrasonic converter is cast at least partially in the recess or the hole.

13. The sensor according to claim 1, wherein, on a surface of the holder or in the holder, an electrically conductive shielding layer is provided.

14. The sensor according to claim 1, including a wire by which the ultrasonic converter contacts the conductive path.

15. The sensor according to claim 1, wherein the holder has a plug-in contact or clip-on contact electrically connected to the conductive path, and the ultrasonic converter has a complementary plug-in contact or clip-on contact plugged into or clipped on the plug-in contact or clip-on contact.

16. The sensor according to claim 1, wherein the ultrasonic converter comprises an SMD and is directly electrically connected with the conductive path.

17. The sensor according to claim 1, including a further ultrasonic converter that converts electrical energy into sound waves useable for examining the document of value and/or for detecting sound waves from the document of value, said further ultrasonic converter generating detection signals, wherein the holder has at least one further recess or one further hole in which the further ultrasonic converter is arranged at least partially, as well as a further conductive path that contacts at least one electrical contact of the further ultrasonic converter.

18. The sensor according to claim 17, wherein the at least one ultrasonic converter is configured as an emitter with a direction-dependent emission characteristic, and the further ultrasonic converter is configured as a receiver with a direction-dependent receiving characteristic, said ultrasonic converters being held relative to each other in such a fashion that upon examining a document of value the receiver will receive at least approximately the highest intensity.

19. The sensor according to claim 1, including an electrical control circuit controlling the ultrasonic converter or for processing signals of the ultrasonic converter, said control circuit located on the holder and connected to the conductive path.

20. A method for mounting an ultrasonic converter converting electrical energy into sound waves for examining a document of value and/or for detecting sound waves from the document of value, and generating detection signals, in a recess or a hole in a holder, comprising insertion of the ultrasonic converter at least partially in the recess or the hole and contacting at least one electrical contact of the ultrasonic converter with a conductive path on or in the holder.

21. The sensor according to claim 5, wherein the at least one surface section of the wall forming the recess or the hole and/or the orientation structure of the wall is arranged to extend at an angle upwardly towards a surface of the holder towards the ultrasonic converter.

22. The sensor according to claim 6, wherein the at least one surface section of the wall forming the recess or the hole and/or the orientation structure of the wall is arranged to extend at an angle upwardly towards a surface of the holder towards the ultrasonic converter.

23. The sensor according to claim 7, wherein the at least one surface section of the inside wall of the recess or of the hole is arranged to extend at an angle upwardly towards a surface of the holder towards the ultrasonic converter.

* * * * *